(12) United States Patent
Hebenstreit

(10) Patent No.: US 7,633,321 B2
(45) Date of Patent: Dec. 15, 2009

(54) DRIVER CIRCUIT; ELECTRONIC CIRCUIT HAVING DRIVER CIRCUIT AND CORRESPONDING METHOD

(75) Inventor: Andreas Hebenstreit, Egling (DE)

(73) Assignee: Infineon Technologies AG, Neubiberg (DE)

( * ) Notice: Subject to any disclaimer, the term of this patent is extended or adjusted under 35 U.S.C. 154(b) by 81 days.

(21) Appl. No.: 11/782,210

(22) Filed: Jul. 24, 2007

(65) Prior Publication Data

US 2009/0027089 A1    Jan. 29, 2009

(51) Int. Cl.
*H03K 3/00*    (2006.01)

(52) U.S. Cl. .................. 327/108; 327/323; 327/540; 361/91.1; 361/92

(58) Field of Classification Search ......... 327/108–109, 327/309, 312–314, 323, 538, 540, 541; 361/91.1, 361/92

See application file for complete search history.

(56) References Cited

U.S. PATENT DOCUMENTS

| | | | |
|---|---|---|---|
| 5,844,425 A | | 12/1998 | Nguyen et al. |
| 5,847,554 A | * | 12/1998 | Wilcox et al. ............... 323/282 |
| 6,140,846 A | * | 10/2000 | Chan et al. .................. 327/108 |
| 6,141,200 A | | 10/2000 | Hinedi et al. |
| 6,208,167 B1 | * | 3/2001 | Ranjan et al. ................. 326/81 |
| 6,294,943 B1 | | 9/2001 | Wall et al. |
| 6,388,476 B1 | | 5/2002 | Isobe et al. |
| 6,597,222 B2 | | 7/2003 | Le et al. |
| 6,731,486 B2 | * | 5/2004 | Holt et al. .................. 361/91.1 |
| 6,906,561 B2 | | 6/2005 | Yu et al. |
| 6,970,024 B1 | | 11/2005 | Reese et al. |
| 7,135,914 B2 | * | 11/2006 | Chih et al. .................. 327/543 |
| 7,209,333 B2 | | 4/2007 | Lee et al. |

FOREIGN PATENT DOCUMENTS

| | | |
|---|---|---|
| DE | 10007607 B4 | 8/2001 |
| EP | 1389833 A2 | 2/2004 |

OTHER PUBLICATIONS

C. Enz, et al., "The Foundations of the EKV MOS Transistor Charge-Based Model", Tech. Proc. of the 2002 Int'l Conf. on Modeling and Simulation of Microsystems, Nanotech 2002 vol. 1, Ch. 13, pp. 666-669 (4 pages), 2002.

* cited by examiner

*Primary Examiner*—An T Luu
(74) *Attorney, Agent, or Firm*—Banner & Witcoff, Ltd.

(57) ABSTRACT

A driver circuit includes an output, at least one transistor including a load section coupled between the output and a supply voltage, and a circuit coupled to a control terminal of the at least one transistor to apply a control voltage to the control terminal in at least one operation mode of the driver circuit. The control voltage is within a predetermined voltage range de-pending on a first predetermined voltage below a nominal voltage range of the output.

23 Claims, 6 Drawing Sheets

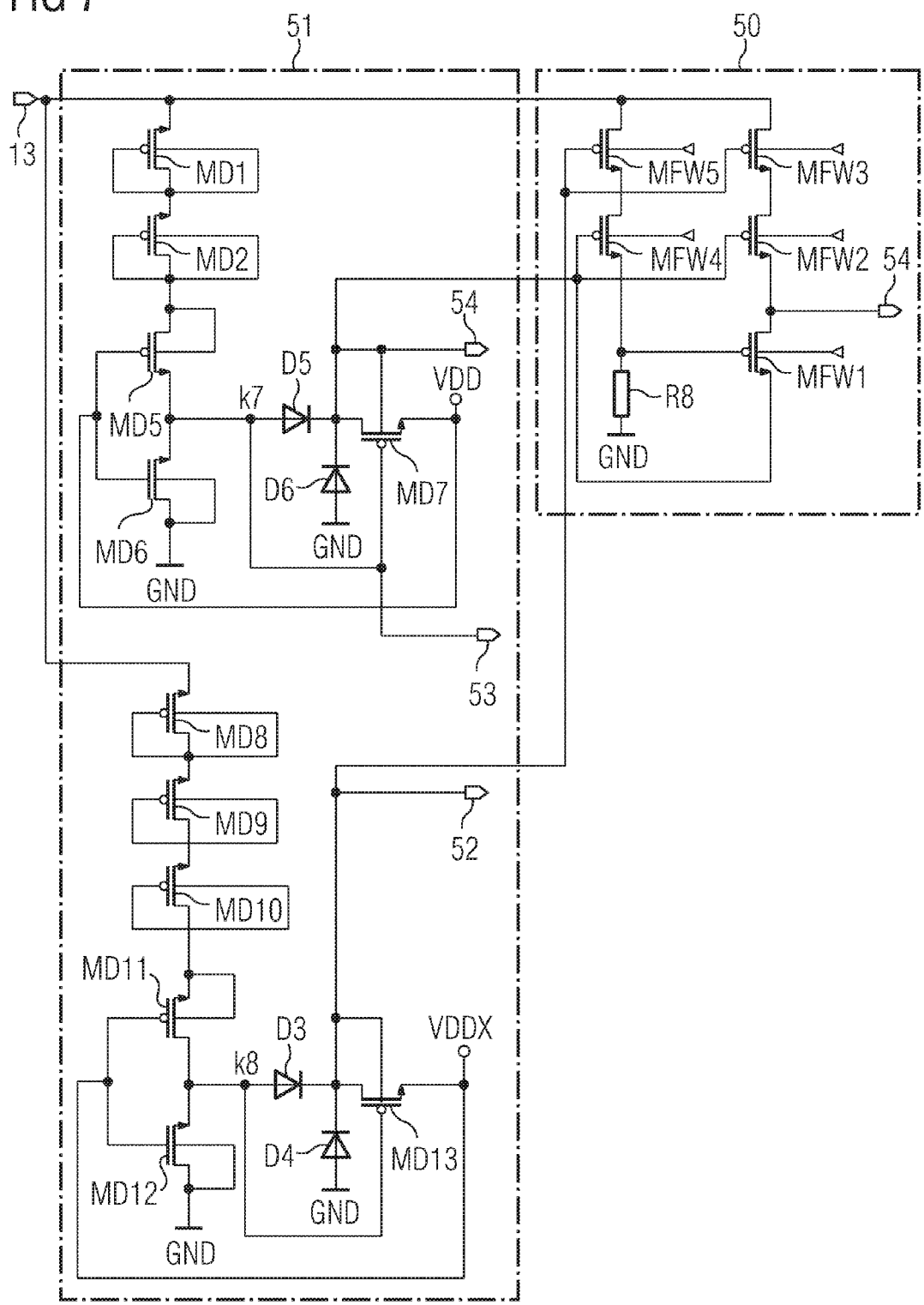

US 7,633,321 B2

1

DRIVER CIRCUIT; ELECTRONIC CIRCUIT HAVING DRIVER CIRCUIT AND CORRESPONDING METHOD

BACKGROUND

In conventional driver circuits, an output data signal is typically output corresponding to an input data signal. Such driver circuits are for example used to drive signals of a chip. Such conventional driver circuits typically have one or more transistors, which, based on their parameters, are adapted for handling voltages in a certain voltage range. An output of the driver circuit is intended to be used for signals within a predetermined nominal voltage range.

However, due to events like short circuits, transients and the like, voltages outside the nominal voltage range may occur at an output of such a driver circuit. Also, a supply voltage of a driver circuit may not be present, for example due to a failure or a switch off. In such cases, voltages may be applied to transistors of the driver circuit exceeding voltages the transistors are designed for, which may lead to a reduced lifetime of the transistors or even failure of the transistors.

SUMMARY

Various aspects are described herein. For example, in an embodiment, a driver circuit for outputting a signal is provided including an output and at least one transistor, wherein a load section of the at least one transistor is coupled between the output and a supply voltage. A circuit portion coupled to a control terminal of the at least one transistor is provided to apply a control voltage to the control terminal, wherein the control voltage is within a predetermined voltage range depending on a first predetermined voltage below a nominal voltage range of the output.

In another embodiment, an electronic circuit including a driver circuit is provided, wherein a voltage generation circuit is provided to generate at least a first voltage and a second voltage different from the first voltage when a supply voltage to be connected to the driver circuit is not present.

These and other aspects of the disclosure will be apparent upon consideration of the following detailed description of illustrative embodiments.

BRIEF DESCRIPTION OF THE SEVERAL VIEWS OF THE DRAWINGS

Hereinafter, illustrative embodiments of the invention will be described with reference to the drawings.

FIG. 7 is a circuit diagram of a portion of a driver circuit according to another illustrative embodiment of the invention.

DETAILED DESCRIPTION

Figure 1:
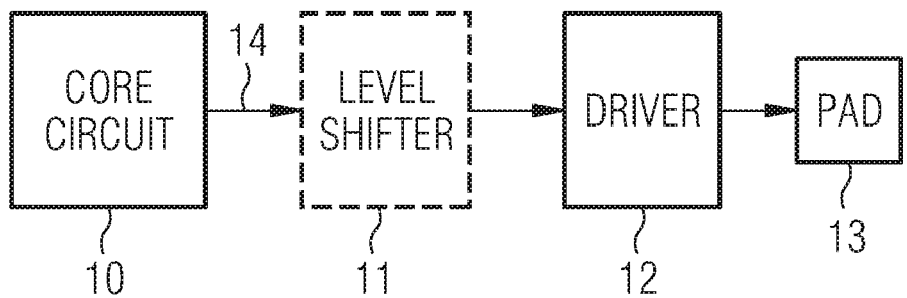
FIG. 1 is a schematic block diagram of an electronic device according to an illustrative embodiment of the invention.

In the following, illustrative embodiments of the present invention will be described in detail. It is to be understood that the following description is given only for the purpose of illustration and is not to be taken in a limiting sense. The scope of the invention is not intended to be limited by the illustrative embodiments described hereinafter.

It is also to be understood that in the following description of illustrative embodiments, any direct connection or coupling between the functional blocks, devices, components, circuit elements or other physical or functional units shown in the drawings or described herein could also be implemented by an indirect connection or coupling. Furthermore, it should be appreciated that the functional blocks or units shown in the drawings may be implemented as separate circuits in embodiments, but may also be fully or partially implemented in a common circuit in other embodiments.

It is to be understood that the features of the various illustrative embodiments described herein may be combined with each other unless specifically noted otherwise.

In the following, illustrative embodiments of driver circuits, electronic devices including driver circuits and corresponding methods of operating driver circuits will be discussed. In an illustrative embodiment, a driver circuit relates to a circuit which receives an input signal and outputs an output signal corresponding to the input signal, wherein the output signal may, for example, be substantially identical to the input signal, be an amplified version of the input signal and/or be an inverted version of an input signal. In an illustrative embodiment of an electronic device, such a driver circuit is used for outputting a signal generated inside the electronic device to outside of the electronic device.

In an illustrative embodiment of the invention which is schematically shown in FIG. 1, the electronic device is an integrated circuit. In the embodiment of FIG. 1, the integrated circuit includes a core circuit 10 which includes, for example, internal logic of the integrated circuit, a memory circuit and the like. In the illustrative embodiment of FIG. 1, core circuit 10 includes an output 14 for outputting a signal on a pad 13 of the integrated circuit. A signal output on output 14 is fed to a driver 12 which outputs the signal to pad 13. In case core circuit 10 operates in a different voltage range than driver circuit 12, a level shifter 11 may be coupled between core circuit 10 and driver 12 to adapt the voltage range of a signal output by core circuit 10 to an appropriate voltage range for driver 12, and, ultimately, pad 13.

While in the schematic diagram of FIG. 1 only one output 14 of core circuit 10 is shown, core circuit 10 may include any number of outputs, wherein each output may be connected with a pad via a driver and, if necessary, a level shifter. Furthermore, a core circuit 10 additionally may include any number of inputs which also may be connected to pads.

In another illustrative embodiment of an electronic device, a driver circuit may be coupled between two circuit portions to forward a signal from one circuit portion to another circuit portion.

Figure 2:
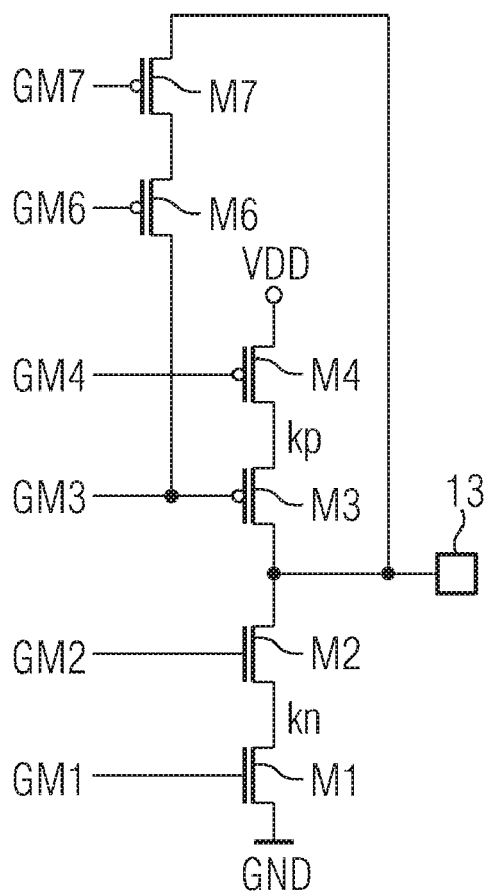
FIG. 2 is a circuit diagram of a driver circuit according to an illustrative embodiment of the invention.

In FIG. 2, an illustrative embodiment of a driver circuit according to the present invention is shown. In the embodiment shown in FIG. 2, a pair of stacked NMOS transistors M1, M2 is coupled between ground GND and pad 13. A node between NMOS transistors M1 and M2 is labeled kn. Furthermore, a pair of stacked PMOS transistors M3 and M4 is coupled between pad 13 and a positive supply voltage VDD, a node between PMOS transistors M3 and M4 being labeled kp. Positive supply voltage VDD and ground GND are supply voltages of the driver circuit. Gate terminals of MOS transistors M1 to M4 are labeled GM1 to GM4, respectively.

NMOS transistors M3 and M4 are also referred to as "HiSide", and NMOS transistors M1 and M2 are referred to as "LoSide".

In the following, transistors generally will be referred to as including two load terminals and a control terminal, the path between the two load terminals being referred to as load section. In case of MOS transistors, the control terminal corresponds to the gate terminal, while the two load terminals correspond to source and drain. In case of bipolar transistors, the control terminal corresponds to the base terminal, while the two load terminals correspond to a collector and an emitter. Transistors may include further terminals like a well terminal or a bulk terminal.

In the embodiment of FIG. 2, furthermore a pair of stacked PMOS transistors M6, M7 is coupled between pad 13 and gate terminal GM3 of PMOS transistor M3. Gate terminals of PMOS transistors M6, M7 are labeled GM6 and GM7, respectively.

In the embodiment of FIG. 2, in a mode of operation where a signal is to be output at pad 13 (in the following also referred to as drive mode), at gate GM2 and GM3, voltages are applied such that load sections of MOS transistors M2 and M3 are conducting. Furthermore, in an illustrative embodiment in drive mode, voltages are applied at gates GM6 and GM7 such that load sections of PMOS transistors M6 and M7 are at least essentially non-conducting. In drive mode, a signal to be output is applied to gates GM4 and GM1 such that depending on the state of the signal applied, one of the load sections of transistors M1 and M4 is conducting, whereas the other one of the load sections of transistors M1 and M4 is non-conducting. Therefore, in drive mode, pad 13 is connected either to VDD or to ground GND, therefore outputting a desired output signal. In the following, instead of explicitly referring to a load section of a transistor as being conducting or non-conducting, for simplicity's sake the transistor will be referred to as being conducting or non-conducting.

In a so called tristate mode, the driver circuit is disabled. In tristate mode, at least one of transistors M1 and M2 and at least one of transistors M3 and M4 is non-conducting, such that pad 13 is decoupled both from ground and from VDD.

In the embodiment of FIG. 2, MOS transistors M1 to M7 are designed to tolerate a voltage VMAX applied between the source and drain or across a gate oxide of the respective MOS transistor in continuous operation, i.e. the transistors when biased with voltages at or below VMAX do not suffer a substantial degradation. On the other hand, at voltages exceeding VMAX, degradation of the transistors reducing their lifetime or even damages to the transistors may occur. The value of VMAX depends e.g. on the design of the transistors, like gate width, gate length and the like. In an illustrative embodiment, VMAX is designed to be at or slightly above VDD, for example 10% or 20% above VDD. In another illustrative embodiment, VMAX may have a value independent from VDD.

In normal operation, at pad 13, voltages between ground and VDD are present in the embodiment of FIG. 2. However, e.g. due to short circuits, transients or the like, in operation of the driver circuit voltages above VDD or voltages below ground may be present at pad 13. This will be explained with reference to FIG. 3.

Figure 3:
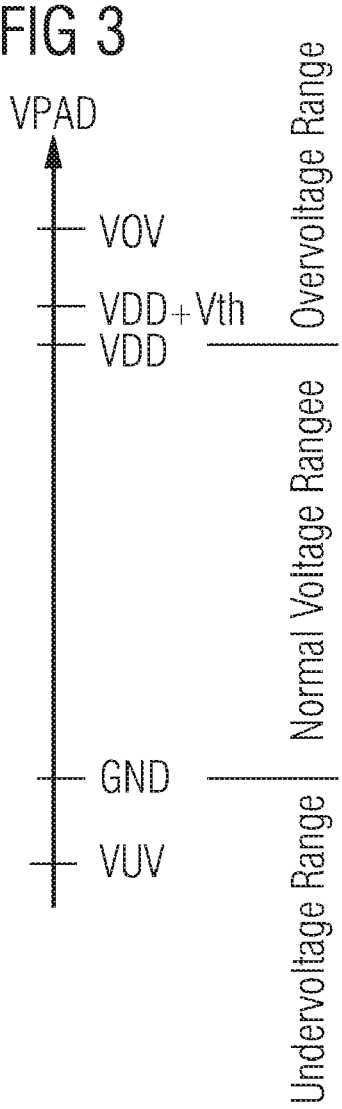
FIG. 3 is an explanatory diagram for illustrating voltage ranges.

In FIG. 3, a voltage range between ground GND and the positive supply voltage VDD is labeled normal voltage range. A voltage range above VDD is labeled overvoltage range, and a voltage range below ground is labeled undervoltage range. In an illustrative embodiment, the voltage applied to gates GM1 to GM7 are controlled such that the circuit is not damaged by voltages at pad 13 in the overvoltage range up to a voltage labeled VOV in FIG. 3 and/or not damaged by voltages in the undervoltage range down to a voltage labeled VUV in FIG. 3. In other words, the voltages applied to the gates in such an illustrative embodiment are chosen such that for voltages at pad 13 between VUV and VOV, no damage to the transistors of the driver circuit may occur or the probability of such a damage is at least significantly reduced. In an illustrative embodiment, as shown in FIG. 3 VOV is above VDD plus a threshold voltage Vth of transistors M1 to M7. In an illustrative embodiment, VOV-VUV is less than 2VMAX− ΔV, ΔV being a predetermined voltage offset.

In an illustrative embodiment, VOV and VUV are predetermined voltages which e.g. may be selected based on other voltages present in an application including the driver circuit, wherein the voltages may be short-circuited to pad 13, on properties of signals for which pad 13 is intended and the like.

In the embodiment of FIG. 2 the path between pad 13 and gate GM3 via load sections of transistors M6 and M7 becomes conducting if a voltage at pad 13 (also labeled VPAD in the following) exceeds a voltage VGM6 at gate GM6 plus a threshold voltage. In this case, the voltage VGM3 at gate GM3 is changed depending on the voltage at pad 13 to protect the transistors, in particular M3 and M4, against the effect of the overvoltage at pad 13. Furthermore, in the embodiment of FIG. 2 for overvoltage and undervoltage protection, the gates GM2, GM3, GM6 and GM7 are supplied with voltages VGM2, VGM3, VGM6 and VGM7, respectively, chosen from a predetermined voltage range depending on the mode of the driver, for example drive mode or tristate mode.

In an illustrative embodiment, the semiconductor structure for realizing the driver circuit of FIG. 2 includes wells for PMOS transistors M3, M4, M6 and M7. In an illustrative embodiment, these wells are biased such that parasitic well diodes formed by the wells and the surrounding semiconductor materials are non-conducting, which also is referred to as floating well.

In an illustrative embodiment, NMOS transistors M1 and M2 are designed to be substantially equal, and PMOS transistors M3 and M4 are designed to be substantially equal. Substantially equal in this case means that the transistors have equal nominal design parameters like gate width, gate length, gate oxide signals and the like. In another illustrative embodiment, the transistors may differ from each other. In an illustrative embodiment, the gate width of transistor M2 is greater than the gate width of transistor M1. In another illustrative embodiment, additionally or alternatively a gate width of transistor M3 is greater than a gate width of transistor M4. In still another illustrative embodiment, a gate width of transistor M6 may be greater than a gate width of transistor M7.

In an illustrative embodiment, when in drive mode or tristate mode a voltage in the undervoltage range is applied to pad 13, when an absolute value of this voltage exceed a diode threshold of a parasitic bulk diode of MOS transistor M1 the parasitic bulk diode of transistor M1 becomes conducting. This limits the path voltage VPAD to about one diode threshold voltage below GND when the under-voltage is supplied by a source having a non-zero internal resistance.

As explained above, in an illustrative embodiment the voltages applied to the gates of the transistors are chosen depending on the mode of the driver circuit, for example drive mode or tristate mode. In another illustrative embodiment, the driver circuit may furthermore have a failsafe mode as an additional mode of operation which is activated when the supply voltage VDD is not present, i.e. not asserted, for some reason like a failure of the corresponding voltage supply. In an illustrative embodiment, in this failsafe mode also voltages are applied to the gates of at least some of the transistors M1 to M7 to provide overvoltage protection and/or undervoltage protection against over or/and undervoltages at pad 13. In an illustrative embodiment, these voltages applied to the gates are generated based on a voltage pad 13, i.e. a voltage at pad 13 is used as a voltage source. In another illustrative embodiment, additionally or alternatively a separate voltage source may be used for generating voltages to be applied to all or some of the gates GM1 to GM7 when the supply voltage VDD is not present.

In an illustrative embodiment, in failsafe mode when VDD is not present the respective connections supplying VDD, e.g. a supply voltage rail, are shunted to ground GND, for example via transistor diodes and the like, such that VDD does not exceed a predetermined value (for example a threshold voltage Vth) when a limited current is fed to VDD, for example through voltages applied to pads of the respective circuit.

Figure 4:
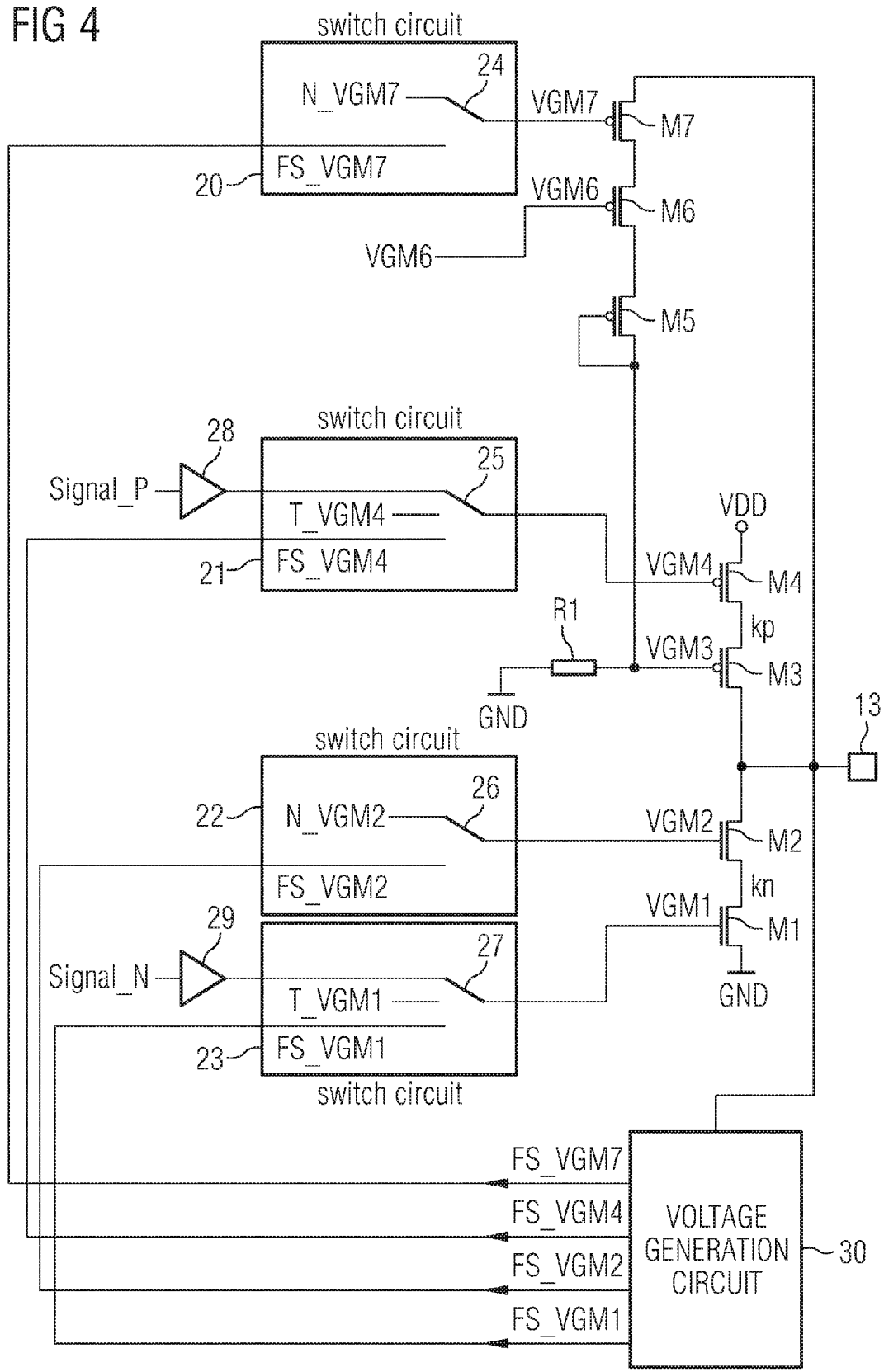
FIG. 4 is a detailed block diagram of a driver circuit according to another illustrative embodiment of the invention.

In FIG. 4, a detailed block diagram of another illustrative embodiment of a driver circuit according to the present invention where features such as the ones discussed above are realized is shown. It should be noted that in other embodiments, only some of the features of the illustrative embodiment of FIG. 4 may be realized.

In the embodiment of FIG. 4, NMOS transistors M1, M2, pad 13, and PMOS transistors M3, M4, M6 an M7 correspond to the same elements already described with reference to FIG. 2 and will therefore not be described again. The voltages applied to the gates of these transistors are labeled VGM1 to VGM4, VGM6 and VGM7, respectively.

In the embodiment of FIG. 4, a PMOS transistor M5 is coupled between PMOS transistor M6 and the gate of PMOS transistor M3. As shown in FIG. 4, PMOS transistor M5 is connected as a diode, i.e. a gate terminal of PMOS transistor M5 is coupled with a load terminal of PMOS transistor M5. In an illustrative embodiment, PMOS transistor M5 is designed essentially equal to PMOS transistor M6. In another illustrative embodiment, a gate width of PMOS transistor M5 is less than a gate width of PMOS transistor M6. In another illustrative embodiment, instead of transistor M5 a different circuit element for providing a desired voltage drop, e.g. a threshold voltage, is provided, for example a diode.

In the embodiment of FIG. 4, a voltage VGM 7 is applied to the gate of PMOS transistor M7 via a switch circuit 20. Switch circuit 20 includes a switch 24 for switching the voltage VGM 7 depending on a state of the driver circuit. In the embodiment of FIG. 4, when the positive supply voltage VDD is present, i.e. during drive mode and tristate mode as explained with reference to FIG. 2, a voltage N_VGM 7 is applied as voltage VGM 7. In failsafe mode, i.e. when VDD is not present, a voltage FS_VGM 7 is selected by switch 24 of switch circuit 20 to be applied as voltage VGM 7.

In an illustrative embodiment, N_VGM7 is less than VMAX+VUV. In another illustrative embodiment, additionally or alternatively N_VGM7 is greater than VOV−VMAX. In this respect, VMAX, VUV and VOV in an illustrative embodiment are defined as already explained with reference to FIG. 3. To give a numerical example, in an illustrative embodiment VMAX may be 3.6 volt, for example in a circuit with a supply voltage VDD of 3.3 volt, VOV may be 5.25 volts to take short circuits from a voltage domain using a supply voltage of 5.25 V into account, and VUV may be −1.0 volt. In this case, N_VGM 7 in an embodiment would be selected to be less than 2.6 volts and greater than 1.65 volts. It is to be understood that these numerical examples are merely illustrative, and the subject embodiment may be used with any other voltages as well.

In the embodiment of FIG. 4, the gate of PMOS transistor M6 is supplied with a voltage VGM 6. In an illustrative embodiment, when in drive mode or tristate mode, VGM 6 may be set to VDD−Vth, i.e. one threshold voltage below VDD. In the embodiment of FIG. 4, no switch circuit is used for applying VGM 6. When VDD fails, a voltage is applied as VGM 6 depending on the potential VDD assumes when VDD is not present. For example, in an illustrative embodiment as explained above where VDD when switched off is shunted to ground, a voltage near ground is applied to the gate of transistor M6 when VDD is not present.

In an illustrative embodiment PMOS transistor M5 is realized including a well structure. In such an illustrative embodiment, the well of PMOS transistor M5 is biased such that parasitic well diodes are non conducting, as has already been explained for PMOS transistors M3, M4, M6 and M7 with reference to FIG. 2.

In the illustrative embodiment of FIG. 4, voltage VGM4 is applied to the gate of PMOS transistor M4 via switch circuit 21 including a switch 25 for selecting voltage VGM4 depending on the mode of the driver circuit. In drive mode, an input signal Signal_P is applied as voltage VGM4 via a buffer 28. Therefore, PMOS transistor M4 in drive mode is conducting or non-conducting, depending on the state of Signal_P.

In tristate mode, a voltage T_VGM4 is selected by switch circuit 21 to be applied as voltage VGM4. In an illustrative embodiment, T_VGM4 is equal to VDD setting PMOS transistor M4 to a non-conducting state. In another illustrative embodiment, T_VGM4 is set to a voltage VDD−ΔV, i.e. somewhat below VDD. ΔV is chosen such that VDD−ΔV is below the threshold for making PMOS transistor M4 fully conductive, but enabling a sub threshold conductance, i.e. enabling a small limited current flowing via the load section of transistor M4 such that in tristate mode node kp is drawn to VDD. In the numerical example given above, ΔV may have a value of about 0.5 V.

In failsafe mode, i.e. when VDD is not present, a voltage FS_VGM4 is selected by switch 25 to be applied as voltage VGM4.

In the embodiment of FIG. 4, the gate of PMOS transistor M3 is connected to ground via a resistor R1. Instead of ground, the gate of transistor M3 may also be connected to a separate negative supply voltage VSS via resistor R1. Therefore, as long as the path from pad 13 to the gate of PMOS transistor M3 via PMOS transistors M5, M6 and M7 is non-conducting, VGM3 corresponds to ground (or VSS) such that PMOS transistor M3 is conducting between source and drain. The connection of the gate of PMOS M3 via R1 to ground serves as a stable bias voltage for M3 during normal operation. The resistance of resistor R1 is chosen such that when the path via PMOS transistors M5 to M7 to pad 13 becomes conducting, VGM3 may be changed depending on the pad voltage VPAD and is drawn again to ground when this path becomes non-conducting again. Resistor R1 of FIG. 4 furthermore provides a bias for NMOS transistor M5.

In the embodiment of FIG. 4, voltage VGM2 is supplied to the gate of NMOS transistor M2 via a switch circuit 22 including a switch 26 to select a voltage as voltage VGM2 depending on the mode of the driver circuit. In the embodiment of FIG. 4, when the driver circuit is in drive mode or in tristate mode, a voltage N_VGM2 is selected as voltage VGM2. In an illustrative embodiment, N_VGM2 is selected to be less than VMAX+VUV. In another illustrative embodiment, additionally or alternatively VGM2 is selected to be greater than VOV+ΔV−VMAX. Taking the same numerical values as given above as an example, in such embodiments N_VGM2 would be less than 2.6 V and/or greater than 2.15 V. At such voltages, NMOS transistor N2 is conducting.

In failsafe mode, switch 26 of switch circuit 22 selects a voltage FS_VGM2 as voltage VGM2 to be applied to the gate of NMOS transistor M2.

In the embodiment of FIG. 4, voltage VGM I is applied to the gate of NMOS transistor MI via a switch circuit 23 including a switch 27 for selecting a voltage to be applied as voltage VGM1 depending on the mode of the driver circuit. In drive mode, an input signal Signal_N is supplied as voltage VGM1 via a buffer 29 and switch circuit 23 such that NMOS transistor M1 becomes non conducting or conducting depending on the state of Signal N. In an illustrative embodiment, Signal_P and Signal_N are equal such that depending on the state of signal_P and signal_N, one of transistors M4 and M1 is conducting while the other one of transistor M4 and M1 is non-conducting as already explained with reference to FIG. 2.

In tristate mode, a voltage T_VGM1 is supplied as voltage VGM1 via switch circuit 23. In an illustrative embodiment, T_VGM1 is equal to ground such that NMOS transistor M1 is non-conducting in tristate mode. In another illustrative embodiment, T_VGM1 is equal to GND+ΔV, wherein ΔV may have the same value or different value from the ΔV explained with reference to voltage T_VGM4 of switch circuit 21. In particular, ΔV is chosen such that when T_VGM1 is applied to the gate of NMOS transistor N1, NMOS transistor N1 does not become fully conductive, but allows a limited sub-threshold current such that node kn is drawn to ground GND.

In failsafe mode, i.e. when VDD is not present, a voltage FS_VGM1 is supplied as voltage VGM1 via switch 27.

In the embodiment of FIG. 4, a voltage generation circuit 30 is provided to generate voltages FS_VGM1, FS_VGM2, FS_VGM4 and FS_VGM7 which are used in failsafe mode using a voltage applied to pad 13 as a voltage supply for voltage generation circuit 30. In another illustrative embodiment, voltage generation circuit 30 additionally or alternatively may have a separate voltage supply independent from VDD. In the illustrative embodiment shown, voltage generation circuit 30 generates four different voltages. In another illustrative embodiment, for two or all three voltages of FS_VGM7, FS_VGM4 and FS_VGM2 a single voltage FS_VG may be used.

As already mentioned, the various features of the embodiment of FIG. 4, i.e. the different switch circuits 20 to 23, the path including PMOS transistors M5 to M7 and a voltage generation circuit 30 may be employed independently from each other in other embodiments of the present invention. Furthermore, while in the embodiment of FIG. 4 switch circuits are used for supplying gate voltages VGM1, VGM2, VGM4 and VGM7, in other embodiments additionally or alternatively switch circuits may be used to apply different voltages as voltages VGM6 and VGM3 depending on the mode of operation. Furthermore, while in the embodiment of FIG. 4 in tristate mode transistors M1 and M4 are set to a non conducting state by applying voltages T_VGM1 and T_VGM4, respectively, in other embodiments additionally or alternatively transistors M2 and M3 may be set to a non-conducting state in tristate mode by applying appropriate voltages, for example via switch circuits. In this case, voltages applied to the gates of transistors M1 and M4 are selected accordingly.

In the embodiment of FIG. 4, voltage generation circuit 30 generates voltages FS_VGM1, FS_VGM2, FS_VGM4 and FS_VGM7 based on a voltage VPAD applied to pad 13 using e.g. voltage dividers.

In an illustrative embodiment, when VPAD is at or near VOV, FS_VGM7 is greater than VOV−VMAX. Furthermore, in an illustrative embodiment when VPAD is at or near VOV, FS_VGM4 is less than VMAX−ΔV, ΔV being defined as above, and/or FS_VGM4 is greater than VOV−ΔV−VMAX. In another illustrative embodiment, when VPAD is at or near VOV, FS_VGM2 is greater than VOV+ΔV−VMAX. In another illustrative embodiment, FS_VGM1 is equal to ground GND. In a different embodiment, FS_VGM1 is equal to GND+ΔV.

In an illustrative embodiment where FS_VG is used for two or all three voltages of FS_VGM7, FS_VGM4 and FS_VGM2, when VPAD is at or near VOV, FS_VG is greater than VOV+ΔV−VMAX and/or less than VMAX−ΔV. Some or all of the various embodiments above specifying limits for the voltages generated by voltage generation circuit 30 may be combined unless the limits given are mutually exclusive.

In case VPAD<VOV, the voltages FS_VGM2, FS_VGM4 and FS_VGM7 in an illustrative embodiment are less than in the case where VPAD is at VOV.

In the above numerical example, FS_VGM1 in an illustrative embodiment is equal to 0.5 V.

As already mentioned, while in the embodiment of FIG. 4 switch circuits are provided for applying voltages VGM1, VGM2, VGM4 and VGM7, some or all of these switch circuits may be replaced by other kinds of circuits for applying desired voltages.

Figure 5:
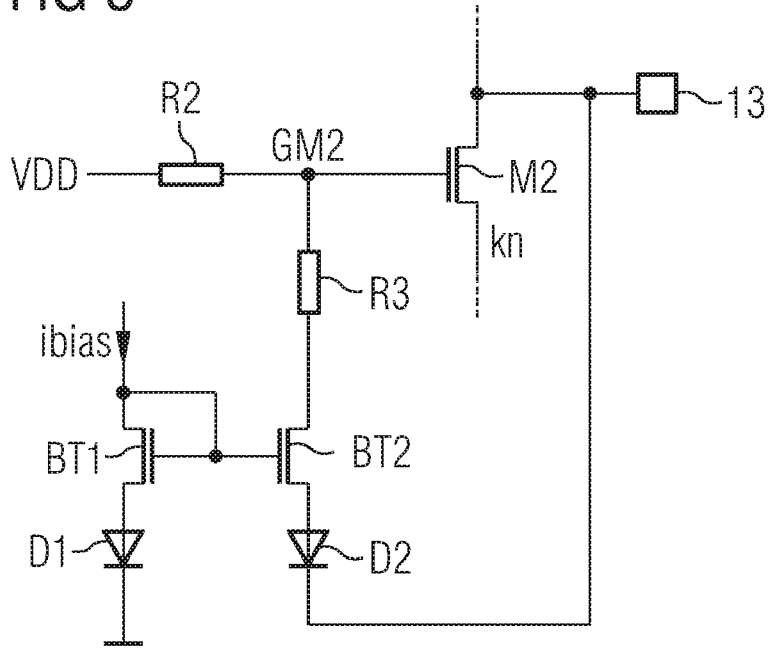
FIG. 5 is a circuit diagram of a pulldown structure of a driver circuit according to another illustrative embodiment of the invention.

Such an illustrative embodiment where switch circuit 22 is replaced by a different circuit portion will next be explained with reference to FIG. 5. FIG. 5 shows a circuit portion for biasing gate GM2 of NMOS transistor M2. In FIG. 5, only a portion of the driver circuit is shown, wherein the remaining driver circuit as indicated by dashed lines in FIG. 5 may for example be realized as shown in FIG. 2 or FIG. 4.

In the illustrative embodiment of FIG. 5, gate GM2 of NMOS transistor M2 is connected to the positive supply voltage VDD via a resistor R2. Furthermore, gate GM2 is coupled with pad 13 via a circuit portion including a resistor R3, NMOS transistors BT1 and BT2, diodes D1 and D2 and a current source generating a bias current ibias. Via R2, in normal operation gate GM2 of NMOS transistor M2 is biased to VDD such that NMOS transistor M2 is conducting. In the case of an undervoltage at pad 13, the voltage VGM2 at gate GM2 is reduced via the circuit shown in FIG. 5. Therefore, the circuit of FIG. 5 forms a pull-down structure lowering the voltage VGM2 in case of an undervoltage at pad 13. In this respect, the function of the circuit shown in FIG. 5 is similar to the circuit including resistor R1 and transistors M5-M7 of FIG. 4, which forms a pull-up structure rising the voltage VGM3 in the case of an overvoltage at pad 13.

In the embodiment of FIG. 5, instead of a switch circuit like switch circuit 22 of FIG. 4 a pull-down circuit as shown in FIG. 5 is provided for controlling gate voltage VGM2. In a similar manner, in another illustrative embodiment instead of the pull-up structure for controlling voltage VGM3 shown in FIG. 4 a switch circuit may be provided for controlling VGM3.

Figure 6A:
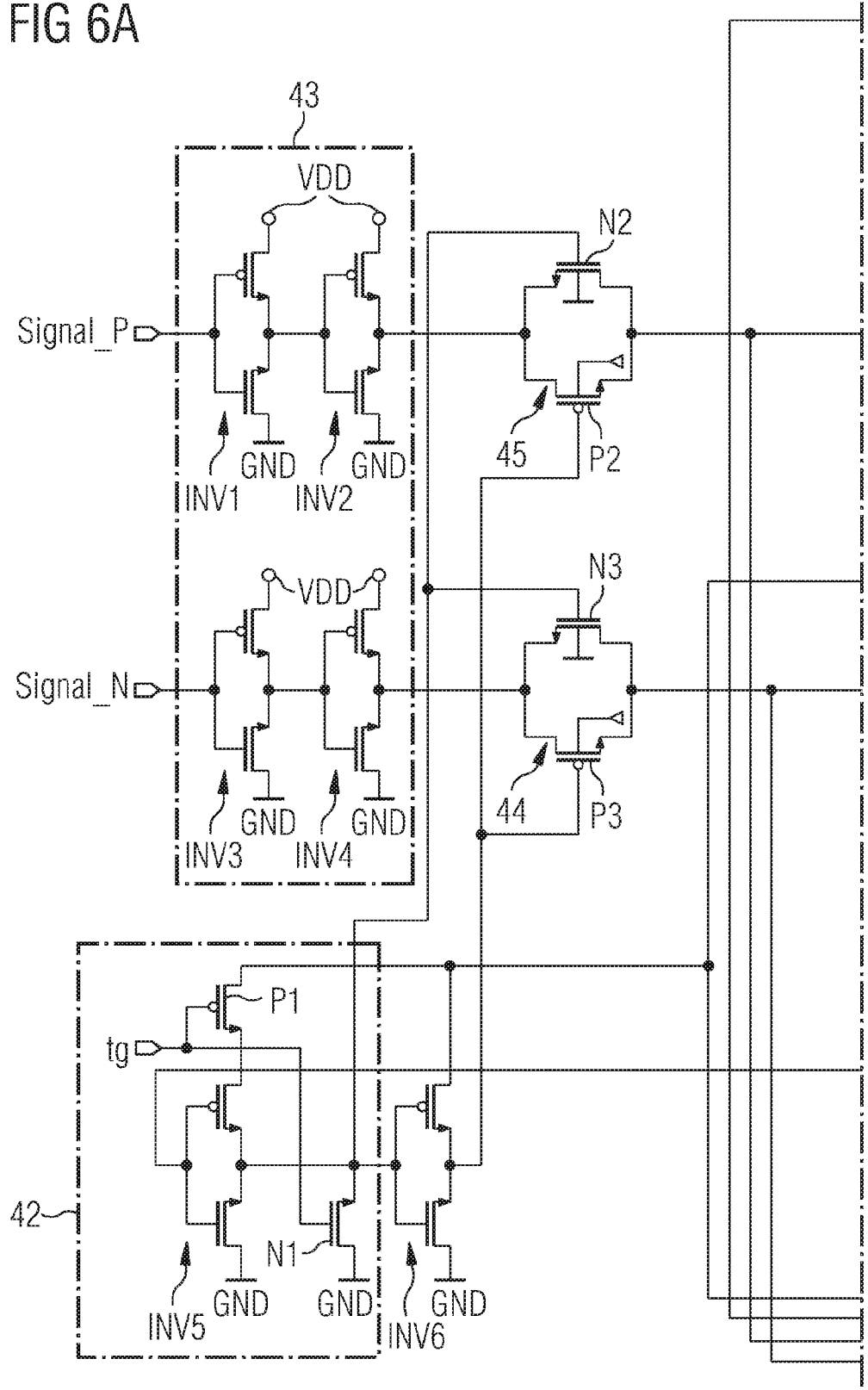
FIGS. 6A and 6B together depict a circuit diagram of a driver circuit according to still another illustrative embodiment of the invention.
Figure 6B:
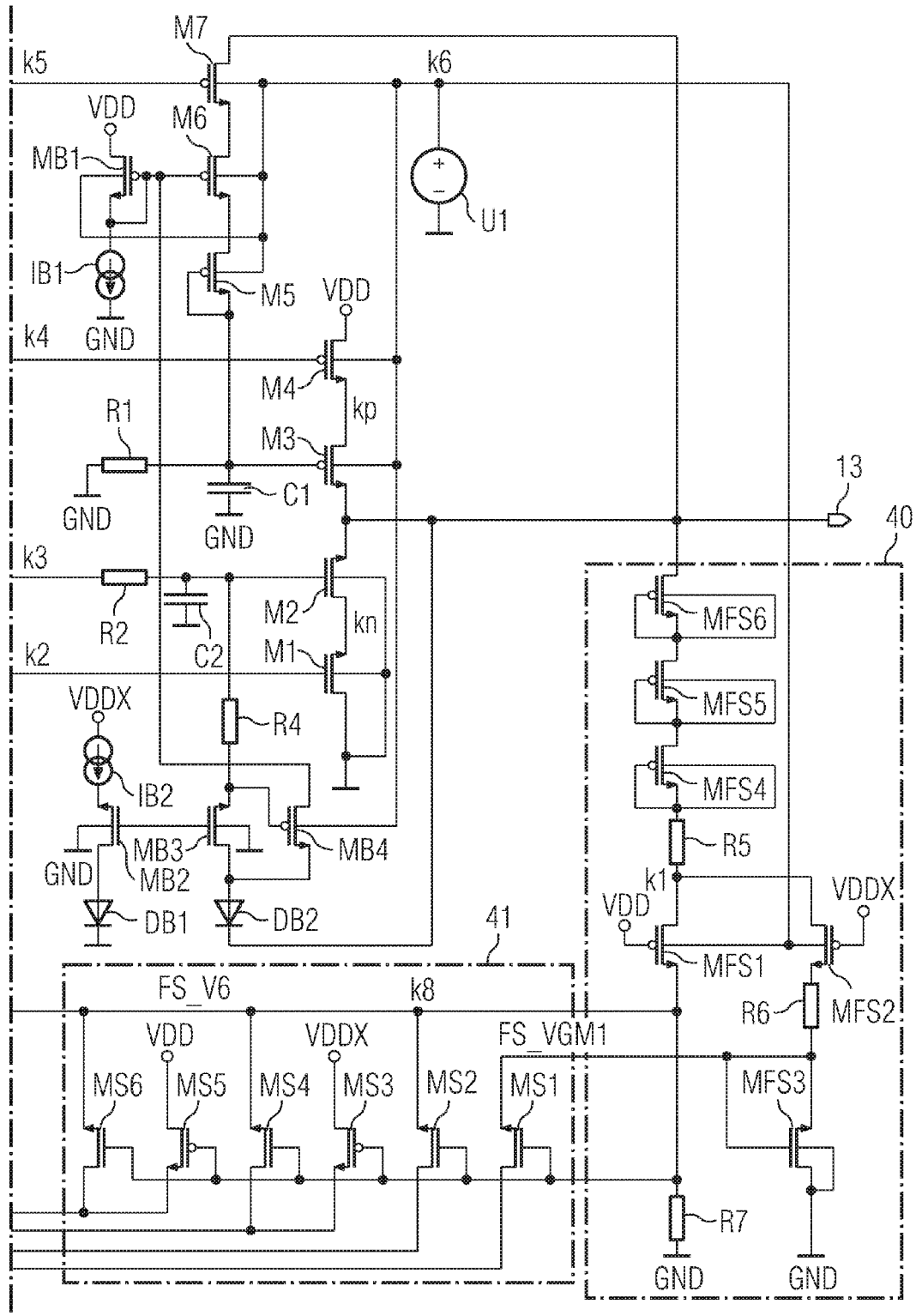

In FIGS. 6A and 6B, a circuit diagram of a further illustrative embodiment of a driver circuit according to the present invention is shown. The driver circuit of the embodiment shown in FIGS. 6A and 6B includes NMOS transistors M1 and M2 and PMOS transistors M3-M7 corresponding to the same elements already discussed with reference to the embodiments of FIGS. 2 and 4. In addition to the connections shown in FIGS. 2 and 4 for these transistors, in FIGS. 6A and 6B the connections of well terminals in the case of PMOS transistors and bulk terminals in the case of NMOS transistors are additionally shown. Basically, in normal operation, i.e. when VDD is present, well terminals of PMOS transistors M3-M7 are biased via a voltage source U1. In an illustrative embodiment, voltage source U1 outputs a voltage at or above VOV. In an illustrative embodiment, voltage source U1 functions independently from supply voltages VDD and VDDX, e.g. by using its own supply voltage or by using a voltage at pad 13.

In the illustrative embodiment of FIGS. 6A and 6B, in normal operation the input signal Signal_P, Signal_N are supplied to a pre-driver stage 43. In pre-driver stage 43, Signal_P is forwarded via two inverters INV1 and INV2 coupled in series, and Signal_N is forwarded via two inverters INV3 and INV4 coupled in series. Each of the inverters INV1-INV4 includes an NMOS transistor and a PMOS transistor as shown in FIGS. 6A and 6B.

The signal corresponding to Signal_P is fed to the gate of PMOS transistor M4 via a transmission gate 45 including an NMOS transistor M2 and a PMOS transistor P2 as shown. The signal corresponding to Signal_N output by pre-driver 43 is fed to the gate of NMOS transistor M1 via a transmission gate 44 including NMOS transistor M3 and PMOS transistor P3 as shown in FIGS. 6A and 6B. Transmission gates 44 and 45 in the embodiment of FIGS. 6A and 6B are controlled by control logic 42 which will be described later in greater detail. With transmission gates 44 and 45, the inputs of signal_P and signal_N may be decoupled from the gates of transistors M4 and M1 in tristate mode and/or in failsafe mode. Therefore, in the embodiment of FIGS. 6A and 6B transmission gates 44 and 45 realize a part of the switching function of switch circuits 21 and 23 of the embodiment of FIG. 4.

Furthermore, in the embodiment of FIGS. 6A and 6B PMOS M3 is coupled with ground via a resistor R1 as already explained with reference to the embodiment of FIG. 4. Additionally, in the embodiment of FIGS. 6A and 6B a coupling of the gate of PMOS transistor M3 with ground via a capacitance C1 is shown, which may be a parasitic capacitance or a capacitance explicitly provided. Resistor R1 and capacitor C1 determine a time constant for biasing the gate of transistor M3 to ground.

Furthermore, in the embodiment of FIGS. 6A and 6B the gate of PMOS transistor M6 is biased via a biasing circuit including PMOS transistor MB1 and a current source IB1 coupled between positive supply voltage VDD and ground as shown in FIGS. 6A and 6B. Through this circuit, the gate of PMOS transistor M6 is biased to a voltage one threshold voltage Vth below VDD, i.e. to VDD-Vth.

In the embodiment of FIGS. 6A and 6B, VDD designates a supply voltage, and VDDX designates an additional supply voltage, VDDX being less than VDD. In a different embodiment, only a single supply voltage VDD may be used. In an embodiment, VDDX may be derived from VDD via a voltage divider.

In the embodiment of FIGS. 6A and 6B the gate of NMOS transistor M2 is coupled to a biasing circuit including a resistor R4, a current source IB2, NMOS transistors MB2 and MB3, a PMOS transistor MB4 and diodes DB1 and DB2. Furthermore, the gate of NMOS transistor M2 is coupled to VDD via resistor R2 and a transistor MS5 which will be explained later in greater detail. In normal operation, this circuit portion coupled to the gate of NMOS M2 acts as a pull-down circuit biasing the gate of transistor M2 in a similar manner as has already been explained with reference to FIG. 5. Similar to PMOS transistor M3, also NMOS transistor M2 is coupled to ground via a capacitor C2 which may be a parasitic capacitor or inserted deliberately.

In the illustrative embodiment of FIGS. 6A and 6B the gate of NMOS transistor M2 is coupled with VDD via PMOS transistor MS5 which is conducting as long as VDD is present and which will be described later in greater detail.

Therefore, in drive mode, when VDD and VDDX are present, VDD is applied to the gate of M2, and VDDX is applied to the gate of M7, while the gate of transistor M3 is biased to ground. Input signals Signal_P and Signal_N are applied to the gates of MOS transistors M4 and M1, respectively, via pre-driver circuit 43 and transmission gates 45 and 44 as shown. Therefore, in this case an output signal at pad 13 corresponds to the input signal Signal_P, Signal_N driven by the driver circuit, in particular by the portion including MOS transistors M1-M4.

In this drive mode, a control signal tg applied to control circuits 42 corresponds to logic zero or GND. Likewise, as will be explained later a voltage FS_VG generated by circuits 40 and 41 is zero. In this case, control circuit 42 including a PMOS transistor P1, an NMOS transistor N1 and an inverter INV5 including a PMOS transistor and an NMOS transistor and which control circuit 42 acts as NOR-gate for control signal tg and voltage signal FS_VG outputs a signal corresponding to VDD or logic one setting NMOS transistors N2 and N3 of transmission gates 45 and 44, respectively, to a conducting state. Via a further inverter INV6 including a PMOS transistor and an NMOS transistor as shown, the inverted output signal of control circuit 42 is fed to the gates of PMOS transistors P3 and P2 such that they are also conducting in drive mode when tg and FS_VG both correspond to a logic zero. Therefore, in this case transmission gates 44 and 45 are conducting.

In an illustrative embodiment, when the driver circuit is set to tristate mode tg and FS_VG remain at logic zero such that transmission gates 44 and 45 are conducting. In such an embodiment, Signal_N and Signal_P in tristate mode are selected such that VDD is applied to the gate of M4, while ground is applied to the gate of M1 such that M1 and M4 are in a non-conducting state.

In another illustrative embodiment, when the driver circuit is set to tristate mode control signal tg is set to logic one or VDD which sets transmission gates 44, 45 to a non-conducting states decoupling predriver circuit 43 from the gates of transistors M1 and M4. In this embodiment by a further circuit (not shown in FIGS. 6A and 6B) a selected voltage may then be applied to the gates of transistors M4 and M1. In an illustrative embodiment, in this case VDD−ΔV is applied to the gate of M4, and GND+ΔV is applied to the gate of NMOS transistor M1.

Furthermore, in the embodiment of FIGS. 6A and 6B a failsafe voltage generation circuit 40 and a failsafe voltage switching circuit 41 are provided which will be explained next.

Failsafe voltage generation unit 40 includes a PMOS transistor MFS1 the gate of which is coupled to VDD and a PMOS transistor MFS2 the gate of which is coupled to VDDX. As shown in FIGS. 6A and 6B, the respective source terminals of PMOS transistors MFS1 and MFS2 are coupled with pad 13 via a resistor R5 and PMOS transistors MFS4, MFS5 and MFS6 each connected as diodes. When VDD and VDDX are present, PMOS transistors MFS1 and MFS2 are non-conducting as their gates are positively biased and the voltage at their respective source terminals does not exceed VDD+Vth (Vth being the threshold voltage) and VDDX+Vth, respectively, because of the voltage drop over resistor R5 and PMOS transistors MFS4-MFS6. In this case FS_VG is drawn to ground corresponding to logic zero via a resistor R7. Consequently, PMOS transistors MS1, MS2, MS4 and MS6 are non-conducting, and PMOS transistors MS3 and MS5 are conducting as already mentioned to apply VDD to the gate of NMOS transistor M2 and VDDX to the gate of PMOS transistor M7.

When VDDP and VDDX are not present, as mentioned VDDP and VDDX at least approximately correspond to ground GND. In this case, PMOS transistors MFS1 and MFS2 become conducting as soon at voltage at node k1 exceeds VDD+Vth and VDDX+Vth, respectively, i.e. as soon as the voltage at node k1 exceeds Vth since VDD and VDDX are approximately zero. In other words, PMOS transistors MFS1 and MFS2 become conducting as soon as a corresponding voltage is applied to pad 13. In this case, a non zero voltage FS_VG is generated at resistor R7. Furthermore, a voltage FS_VGM1 is generated at a node between a resistor R6 and an NMOS transistor MFS3. By choosing the properties of the elements of failsafe voltage generation circuit 40 accordingly, FS_VG and FS_VGM1 may be set to desired values depending on pad voltage VPAD at pad 13. In an illustrative embodiment, when VPAD corresponds to VOV, FS_VG is greater than VOV+ΔV−VMAX and less than VMAX−ΔV, and FS_VGM1 corresponds to GND+ΔV, the values being determined by the voltage drop over transistors MFS3-MFS6 and resistors R5-R7.

In this case, the non zero voltage FS_VG sets NMOS transistor MS 1, MS2, MS4 and MS6 to a conducting state and PMOS transistors MS3 and MS5 to a nonconducting state. Therefore, FS_VG is applied to the gates of transistors M2, M4 and M7, and FS_VGM1 is applied to the gate of NMOS transistor M1. Furthermore, FS_VG is fed to control circuit 42 and, by being non zero, causes transmission gates 44 and 45 to become non-conducting.

In the embodiment of FIGS. 6A and 6B, the circuit is generally supplied with positive supply voltages VDDX and VDD with respect to ground. Instead of ground, one or more negative supply voltages VSS different or decoupled from a ground potential may also be provided. In this case, in an illustrative embodiment voltages applied to the gates of transistors are adapted depending on VSS.

It is to be understood that the circuit diagram shown in FIGS. 6A and 6B only serves for illustrating a possible realization of an illustrative embodiment of the present invention, and embodiments of the present invention are not limited to the circuit diagram shown in FIGS. 6A and 6B. Some alternatives to the circuit of FIGS. 6A and 6B in another illustrative embodiment of the present invention will next be described with reference to FIG. 7.

In FIG. 7, a well voltage generation circuit 50 is shown which, in an illustrative embodiment, may be provided as an alternative or additionally to voltage supply U1 in FIGS. 6A and 6B. Furthermore, in FIG. 7 an auxiliary voltage generation circuit 51 is shown which in an illustrative embodiment may be provided as an alternative or additionally to circuits 40 and 41 of the embodiment of FIGS. 6A and 6B. It should be noted that well voltage generation circuit 50 and auxiliary voltage generation circuit 51 in an illustrative embodiment may be realized in combination with each other, but in other embodiments also only one of these circuits or none of these circuits may be implemented.

First, well voltage generation circuit 50 will be described.

Well voltage generation circuit 50 includes PMOS transistors MFW1, MFW2, MFW3, MFW4 and MFW5 as shown in FIGS. 6A and 6B. An output 55 is coupled to a node between PMOS transistors MFW1 and MFW2. As will be explained later when discussing the auxiliary voltage generation circuit 51, when VDD and VDDX are present, gates of PMOS transistors MFW4 and MFW2 as well as a load terminal of MFW1 are connected to VDD, the other load terminal of MFW1 being connected to output 55. Gate terminals of transistors MFW3 and MFW5 are connected to VDDX in this case. As will be described later, when VDD and VDDX are not present, they are replaced by auxiliary voltages derived from a voltage applied to pad 13 generated by auxiliary voltage generation circuit 51.

A gate of PMOS transistor MFW1 is coupled with a load terminal of transistor MFW4 and via a resistor R8 with ground. Load terminals of transistors MFW5 and MFW3 are connected with pad 13 in the embodiment of FIG. 7. At output 55, as long as a voltage VPAD at pad 13 is less than VDD, VDD is output, and when VPAD>VDD, VPAD is output. As already mentioned, in an illustrative embodiment well voltage generation circuit 50 is provided additionally or alternatively to voltage source U1 of FIGS. 6A and 6B. In such an illustrative embodiment, output 55 is coupled to node k6 of FIGS. 6A and 6B.

Next, auxiliary voltage generation circuit 51 will be described.

Auxiliary voltage generation circuit 51 includes a first circuit portion including PMOS transistors MD1, MD2, MD5 and MD7, NMOS transistor MD6 and diodes D5, D6. A second circuit portion includes PMOS transistors MD8, MD9, MD10, MD11 and MD13, NMOS transistor MD12 and diodes D3 and D4. First circuit portion serves for generating an auxiliary voltage replacing VDD in case of failure of VDD, and second circuit portion serves for generating an auxiliary voltage replacing VDDX in case of failure thereof, wherein in both cases the auxiliary voltage is generated using a voltage at pad 13 as a voltage source. The first circuit portion will be described first.

As long as VDD is present, transistor MD5 is non-conducting, while transistor MD6 is conducting, connecting an output 53 to ground. Furthermore, transistor MD7 becomes conducting via MD6 as its gate is drawn to ground connecting output 54 with VDD.

When VDD is not present, and at or near ground as described above, PMOS transistor MD5 becomes conducting and NMOS transistor MD6 becomes non-conducting. Therefore, at node k7 a voltage corresponding to the voltage VPAD at pad 13 reduced by two diodes threshold voltages of PMOS transistors MD1 and MD2 which are connected as diodes is present. This voltage is applied to the gate of PMOS transistor MD7 which becomes non-conducting. The voltage at node k7 is output as auxiliary voltage at output 53 and, reduced by a diode voltage of D5, at output 54. In summary, when VDD is present, at output 54 VDD is output, and at output 53 ground (corresponding to logic 0) is output, and when VDD is not present, the reduced pad voltage VPAD (reduced by the diode thresholds of MD1 and MD2) is output at outputs 53 and 54, wherein the voltage at output 54 again is reduced by diode D5.

Next, the second circuit portion mentioned above will be described. The second circuit portion basically corresponds to the first circuit portion described above, wherein only one output 52 corresponding to output 54 of the first circuit portion is present in the embodiment shown in FIG. 7. However, in another illustrative embodiment, in the second circuit portion a second output corresponding to output 53 may be present instead of or in addition to output 53. Instead of being supplied with VDD, the second circuit portion is supplied with VDDX. PMOS transistor ND13 corresponds to PMOS transistor ND7, diodes D3 and D4 correspond to diodes D5 and D6, respectively, node k8 corresponds to node k7, and transistors MD11 and MD12 correspond to transistors MD5 and MD6, respectively. Similar to what has been described for the first circuit portion, when VDDX is present, VDDX is output at output 52. When VDDX is not present, a voltage corresponding to VPAD reduced by diode thresholds is output. In contrast to the first circuit portion, in the second circuit portion three PMOS transistors MD8 to MD10 connected as diodes are present, such that the voltage output at output 52 when VDDX is not present is less by one threshold than the voltage output at output 54 when VDD is not present. However, the number of transistors connected as diodes in the first circuit portion and the second circuit portion shown in FIG. 7 serves only as an example, and the number of such transistors connected as diodes and their dimensions may be adapted to obtain a desired reduction of the pad voltage VPAD for the voltage output in case the respective supply voltage VDD of VDDX is not present. Furthermore, in another illustrative embodiment instead or in addition to transistors connected as diodes, other circuit elements for providing a voltage drop, for example resistors, diodes and the like, may be present. In yet another illustrative embodiment, e.g. if a driver uses only one supply voltage VDD, only the first circuit portion may be present.

As already mentioned, the auxiliary voltage generation circuit 51 may be used as an alternative or in addition to circuits 40 and 41 of the embodiment of FIGS. 6A and 6B, for example as a replacement for the portion of circuits 40, 41 generating voltage FS_VG and supplying the gates of transistors M2, M7, M4. In such an illustrative embodiment, output 53 of auxiliary voltage generation circuit 51 may be coupled to the gates of transistors MS1 and MS2 of FIGS. 6A and 6B as well as to the input of inverter 5 for controlling transmission gates 44 and 45, output 54 may be coupled to node k3 of FIGS. 6A and 6B, and output 52 may be coupled to node k5 of FIGS. 6A and 6B. Output 54 additionally may be coupled to node k2, and/or additionally may be coupled to a node k8.

In the embodiment described with reference to FIGS. 2, 4 and 6A and 6B, the driver circuit includes a HiSide including two stacked PMOS transistors M3 and M4 and a LoSide including two stacked NMOS transistors M1 and M2. In another illustrative embodiment of the invention, a different configuration may be used. Furthermore, more than two transistors may be coupled in series for forming the HiSide and/or the LoSide. Other transistor configurations are also possible. One such configuration according to an illustrative embodiment of the present invention will be described with reference to FIG. 8.

Figure 8:
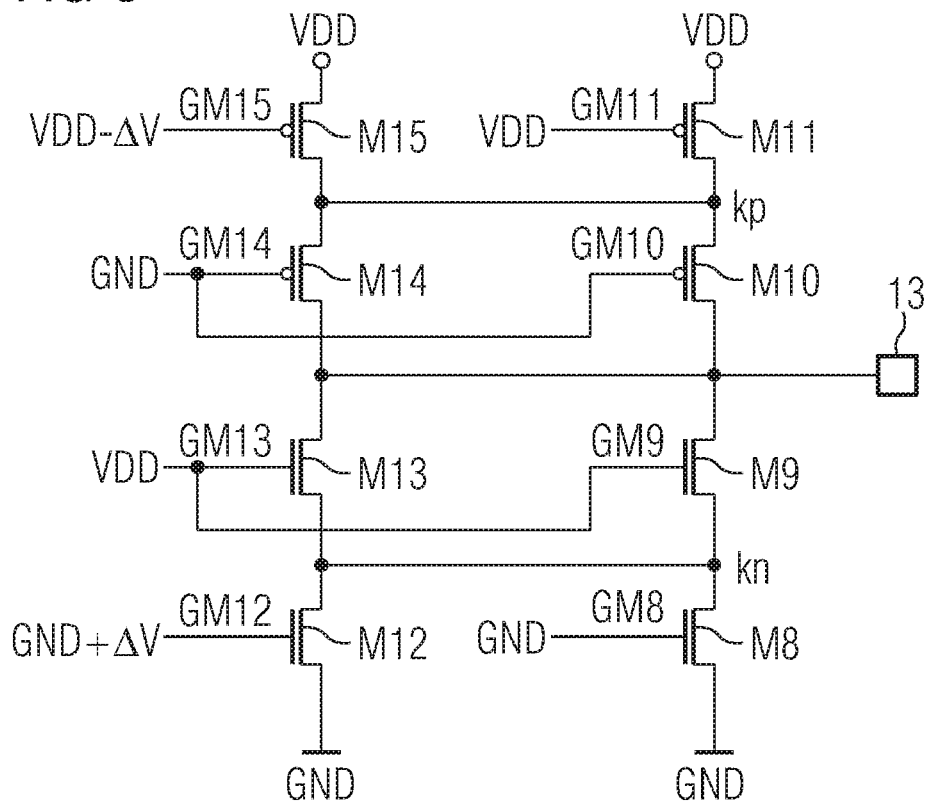
FIG. 8 is a circuit diagram of a driver circuit according to a further illustrative embodiment of the invention.

In the embodiment of FIG. 8, two parallel branches for the HiSide, i.e. between VDD and pad 13, and two parallel branches for the LoSide, i.e. between ground and pad 13, are provided. Each branch includes two MOS transistors. In particular, a first branch between pad 13 and VDD includes PMOS transistors M10 and M11 having gates GM10 and GM11, respectively, a second branch between pad 13 and VDD includes PMOS transistors M14 and M15 having gate terminals GM14 and GM15, respectively, a third branch between pad 13 and ground includes NMOS transistors M8 and M9 having gates GM8 and GM9, respectively, and a fourth branch between pad 13 and ground includes NMOS transistors M12 and M13 having gates GM12 and GM13, respectively. In an illustrative embodiment, the MOS transistors in a branch are stacked transistors.

Basically, in the embodiment of FIG. 8, the structure of the previously discussed embodiments including transistors M1 to M4 is doubled. In another illustrative embodiment, more than two parallel branches, for example three or more parallel branches, may be used.

In an illustrative embodiment, MOS transistors M12 to M15 are designed equal to MOS transistors M8 to M11. In another illustrative embodiment, a gate width of MOS transistors M12 to M15 is less than a gate width of the corresponding MOS transistors M8 to M11.

In the embodiment of FIG. 8, gates GM10 and GM14 are connected, and gates GM9 and GM13 are connected. In an illustrative embodiment, the structure of FIG. 8 replaces transistors M1 to M4 in the embodiments of FIGS. 4 or 6. In this case, gates GM14 and GM10 are connected corresponding to the gate of transistor M3, and gates GM13 and GM9 are connected corresponding to the gate of transistor M2.

In an illustrative embodiment, the gates GM11 and GM15 are connected like the gate of transistor M4, and the gates GM8 and GM12 are connected like the gate of transistor M1 in the embodiments of FIGS. 4 and 6. In another illustrative embodiment, in drive mode, gates GM11 and GM15 are both supplied with signal_P, and gates GM8 and GM12 are both supplied with signal_N. In tristate mode and/or in failsafe mode, different voltages are applied to gates GM11 and GM15, and/or different voltages are applied to gates GM8 and GM12. As an example, in FIG. 8 voltages applied in tristate mode in such an embodiment are shown. In the example shown, in tristate mode gates GM14 and GM10 are coupled to ground GND, and gates GM13 and GM9 are coupled to VDD.

GM11 is coupled to VDD, and GM8 is coupled to ground in this illustrative tristate mode such that transistors M8 and M11 are fully non-conducting. GM15 is set to VDD−ΔV, and GM12 is set to ground GND+ΔV, ΔV being selected as already explained above such that transistors M12 and M15 exhibit some limited sub-threshold conductance. Therefore, in tristate mode node kp is drawn to VDD, and node kn is drawn to ground.

In an illustrative embodiment, also in a failsafe mode, different voltages are supplied to GM11 and GM15, and to GM8 and GM12 such that transistors M8 and M11 are fully non-conducting, but transistors M12 and M15 exhibit some subthreshold conductance.

It should be noted that the above-described embodiments are intended to be taken in an illustrative sense only and are not to be construed as limiting the scope of the present invention. In particular, further modifications and variants may be implemented in other embodiments in addition to the ones already described without departing from the scope of the present invention. For example, while the embodiments discussed are based on MOS transistors, in other illustrative embodiments other types of field effect transistors, for example JFETs (Junction Field Effect Transistors) or bipolar transistors may be used. In still other embodiments, different types of transistors are used in combination. Furthermore, since the switching behavior of a PMOS transistor basically corresponds to the switching behavior of an NMOS transistor with an inverter at its gate, corresponding replacements may be made in embodiments. In another illustrative embodiment, in drive mode the signals supplied to M3 and M4 and/or the signals supplied to M1 and M2 may be exchanged. In still another illustrative embodiment, another configuration may be used for outputting a signal. The scope of the present invention is intended to be defined only by the appended claims and equivalents thereof.

What is claimed is:

1. A driver circuit for outputting a signal, comprising:
an output,
at least one transistor including a load section, the load section being coupled between said output and a supply voltage, and
a circuit coupled to a control terminal of said at least one transistor to apply a control voltage to said control terminal in at least one operation mode of said driver circuit,
wherein said control voltage is within a predetermined voltage range depending on a first predetermined voltage below a nominal voltage range of said output,
wherein said supply voltage includes a first supply voltage and a second supply voltage,
wherein said at least one transistor further comprises a first transistor, a second transistor, a third transistor and a fourth transistor,
wherein load sections of said first transistor and said second transistor are coupled in series between a first supply voltage and said output, and
wherein load sections of said third and fourth transistors are coupled in series between said output and a second supply voltage, said second supply voltage being greater than said first supply voltage.

2. The driver circuit according to claim 1, wherein said circuit comprises a switch circuit to selectively apply said control voltage to said at least one transistor depending on said operation mode of said driver circuit.

3. The driver circuit according to claim 2,
wherein said driver circuit further comprises a voltage generation circuit to generate a voltage signal when a supply voltage of said driver circuit is not present, and
wherein said switch circuit is configured to apply said voltage signal to said control input of said at least one transistor when said supply voltage is not present.

4. The driver circuit according to claim 1, wherein in an operation mode in which said driver circuit is disabled, a control terminal of said first transistor is coupled to a first control voltage enabling a limited sub-threshold conducting of said first transistor.

5. The driver circuit according to claim 1,
wherein in an operation mode of said driver circuit for outputting a signal and in an operation mode where said driver circuit is disabled, a control terminal of said second transistor is coupled to a second control voltage,
wherein said second control voltage is less than a maximum voltage tolerated by said second transistor added to said first predetermined voltage, and
wherein said second control voltage is greater than a second predetermined voltage above said nominal voltage range added to a predetermined voltage offset minus a maximum voltage tolerated by said second transistor.

6. The driver circuit according to claim 1, wherein a control input of said second transistor is coupled to said second supply voltage via a first resistor and is coupled to said output via at least one further circuit element.

7. The driver circuit according to claim 1, wherein a control input of said third transistor is coupled with said first supply voltage via a second resistor and is coupled with said output via at least one further circuit element.

8. The driver circuit according to claim 7,
wherein said at least one further circuit element comprises a fifth transistor, a sixth transistor and a seventh transistor, the load sections of which are connected in series between said control terminal of said third transistor and said output,
wherein said fifth transistor is connected as a diode.

9. The driver circuit according to claim 8,
wherein a control input of said sixth transistor is connected to a third control voltage, said third control voltage being between a threshold voltage below said second supply voltage and said second supply voltage,
wherein a control input of said seventh transistor is coupled to a fourth control voltage when said driver circuit is in an operation mode where a signal is output or in an operation mode where said driver circuit is disabled,
wherein said fourth control voltage is less than a maximum voltage tolerated by said seventh transistor added to said first predetermined voltage, and
wherein said fourth control voltage is greater than a second predetermined voltage above said nominal voltage range minus said maximum tolerated voltage.

10. The driver circuit according to claim 8,
wherein said fifth to seventh transistors are MOS transistors,
wherein a gate width of said fifth transistor is less than a gate width of said sixth transistor, and
wherein a gate width of said sixth transistor is greater than a gate width of said seventh transistor.

11. The driver circuit according to claim 1, wherein in an operation mode where said driver circuit is disabled, a control terminal of said fourth transistor is coupled to a fifth control voltage enabling a limited sub-threshold conducting of said first transistor.

12. The driver circuit according to claim 1,
wherein said first to fourth transistors are MOS transistors,
wherein a gate width of said third transistor is greater than a gate width of said fourth transistor, and
wherein a gate width of said second transistor is greater than a gate width of said first transistor.

13. The driver circuit according to claim 1, further comprising:
an eighth transistor, a ninth transistor, a tenth transistor and an eleventh transistor, said eighth transistor being connected in parallel to said first transistor, said ninth transistor being connected in parallel to said second transistor, said tenth transistor being connected in parallel to said third transistor and said eleventh transistor being connected in parallel to said fourth transistor,
wherein said first to fourth transistors and said eighth to eleventh transistors are MOS transistors,
wherein a gate width of said first to fourth transistors is less than a gate width of said eighth to eleventh transistors, and
wherein in an operation mode where said driver circuit is disabled, a control terminal of said first transistor and a control terminal of said fourth transistor are coupled with respective supply voltages enabling a limited sub-threshold conducting of said first transistor and said second transistor, and said eighth transistor and said eleventh transistor are non-conductive.

14. An electronic circuit comprising:
a driver circuit for outputting a signal, said driver circuit including
an output,
a first circuit element and a second circuit element, and
a supply voltage input to be connected to a supply voltage,
a voltage generation circuit configured to generate at least a first voltage and a second voltage different from said first voltage when said supply voltage is not present, and a connection circuit configured to couple said first voltage with a first terminal of said first circuit element and said second voltage with a second terminal of said second circuit element when said supply voltage is not present, wherein said first voltage is less than a maximum voltage tolerated by said first and second circuit elements minus a predetermined voltage offset, and wherein said first voltage is greater than a predetermined maximum voltage above a nominal voltage range of said output plus a predetermined voltage offset minus a maximum voltage tolerated by said first and said second circuit elements.

15. The electronic circuit according to claim 14, wherein said voltage generation circuit is coupled with said output to generate said first voltage and said second voltage based on a voltage present at said output.

16. The electronic circuit according to claim 15,
wherein said voltage generation circuit comprises at least one voltage reducing element coupled between said output and a first voltage output for outputting said first voltage,
wherein said at least one voltage reducing element comprises at least one element chosen from the group comprising a resistor, a diode and a transistor connected as a diode.

17. The electronic circuit according to claim 15, wherein said voltage generation circuit comprises a switch element coupled between said output and a first voltage output for outputting said first voltage, said switch element being conductive when said supply voltage is not present and being non-conductive when said supply voltage is present.

18. The electronic circuit according to claim 14,
wherein said supply voltage is a positive supply voltage, and
wherein said second voltage is equal to a further supply voltage less than said positive supply voltage plus a predetermined voltage offset.

19. The electronic circuit according to claim 14,
wherein said first circuit element is a first transistor having a load section, said first terminal being a control terminal of said first transistor,
wherein said second circuit element is a second transistor having a load section, said second terminal being a control terminal of said second transistor,
wherein the load sections of said first transistor and said second transistor are coupled in series between a further supply voltage and said output, said driver circuit further comprising a third transistor having a load section and a fourth transistor having a load section, the load sections of said third transistor and said fourth transistor being coupled in series between said output and said supply voltage which is greater than said further supply voltage, and
wherein a control terminal of said fourth transistor is coupled to said voltage generation circuit when said supply voltage is not present to receive a voltage therefrom.

20. A method of operating a driver circuit for outputting a signal, said driver circuit including an output and at least one transistor having a load section, the load section being coupled between said output and a supply voltage, wherein said at least one transistor includes a first transistor and a second transistor, said method comprising:

generating a first control voltage within a predetermined voltage range depending on a first predetermined voltage below said nominal voltage range of said output;

applying said first control voltage to a control terminal of said at least one transistor in at least one operation mode of said driver circuit; and coupling, in an operation mode of said driver circuit for outputting a signal and in an operation mode where said driver circuit is disabled, a control input of said second transistor to a second control voltage, wherein said second control voltage is less than a maximum voltage tolerated by said second transistor added to said first predetermined voltage, and wherein said second control voltage is greater than a second predetermined voltage above said nominal voltage range added to a predetermined voltage offset minus a maximum voltage tolerated by said second transistor.

21. A method for operating a driver circuit, said driver circuit including an output, a first circuit element and a second circuit element, a supply voltage input to be connected to a supply voltage, said method comprising:

detecting a presence of said supply voltage, generating at least a first voltage and a second voltage different from said first voltage when said supply voltage is not present, and coupling said first voltage with a first terminal of said first circuit element and said second voltage with a second terminal of said second circuit element when said supply voltage is not present, wherein said first voltage is less than a maximum voltage tolerated by said first and second circuit elements minus a predetermined voltage offset, and wherein said first voltage is greater than a predetermined maximum voltage above a nominal voltage range of said output plus a predetermined voltage offset minus a maximum voltage tolerated by said first and said second circuit elements.

22. The method according to claim 21, wherein said generating said first voltage and said second voltage comprises generating said first voltage and said second voltage based on a voltage present at said output.

23. A driver circuit for outputting a signal, comprising:
an output,
at least one transistor including a load section, the load section being coupled between said output and a supply voltage, and
a circuit coupled to a control terminal of said at least one transistor to apply a control voltage to said control terminal in at least one operation mode of said driver circuit,
wherein said control voltage is within a predetermined voltage range depending on a first predetermined voltage below a nominal voltage range of said output,
wherein said circuit comprises a switch circuit to selectively apply said control voltage to said at least one transistor depending on said operation mode of said driver circuit,
wherein said driver circuit further comprises a voltage generation circuit to generate a voltage signal when the supply voltage of said driver circuit is not present, and
wherein said switch circuit is configured to apply said voltage signal to said control input of said at least one transistor when said supply voltage is not present.

* * * * *